(12) United States Patent
Han et al.

(10) Patent No.: US 8,871,563 B2
(45) Date of Patent: Oct. 28, 2014

(54) METHOD OF MANUFACTURING ORGANIC-LIGHT-EMITTING-DIODE FLAT-PANEL LIGHT-SOURCE APPARATUS

(71) Applicant: Electronics and Telecommunications Research Institute, Daejeon (KR)

(72) Inventors: Jun Han Han, Daejeon (KR); Hye Yong Chu, Daejeon (KR); Jeong Ik Lee, Gyeonggi-do (KR); Doo Hee Cho, Daejeon (KR); Jong Hee Lee, Daejeon (KR); Joo Won Lee, Seoul (KR); Jin Wook Shin, Incheon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/795,006

(22) Filed: Mar. 12, 2013

(65) Prior Publication Data

US 2013/0189895 A1   Jul. 25, 2013

Related U.S. Application Data

(62) Division of application No. 13/078,095, filed on Apr. 1, 2011, now Pat. No. 8,421,064.

(30) Foreign Application Priority Data

Apr. 9, 2010   (KR) .......... 10-2010-0032773
Nov. 1, 2010   (KR) .......... 10-2010-0107660

(51) Int. Cl.
| | |
|---|---|
| *H01L 51/40* | (2006.01) |
| *H05B 33/10* | (2006.01) |
| *H05B 33/26* | (2006.01) |
| *H01L 51/56* | (2006.01) |
| *H01L 51/52* | (2006.01) |
| *H01L 27/32* | (2006.01) |

(52) U.S. Cl.
CPC ............... *H05B 33/10* (2013.01); *H05B 33/26* (2013.01); *H01L 51/56* (2013.01); *H01L 51/5228* (2013.01); *H01L 27/3288* (2013.01); *H01L 51/5212* (2013.01)
USPC ................ 438/99; 438/22; 445/24; 445/29

(58) Field of Classification Search
CPC . H01L 51/50; H01L 51/5212; H01L 51/5228; H01L 51/56; H01L 27/3288; H05B 33/10; H05B 33/26
USPC .................... 438/22, 99; 445/24, 29
See application file for complete search history.

(56) References Cited

U.S. PATENT DOCUMENTS

| | | | |
|---|---|---|---|
| 6,091,195 A | 7/2000 | Forrest et al. | |
| 6,198,219 B1 | 3/2001 | Arai et al. | |

(Continued)

FOREIGN PATENT DOCUMENTS

| | | | |
|---|---|---|---|
| JP | 2003-123990 A | 4/2003 | |
| JP | 2004-152699 A | 5/2004 | |

(Continued)

*Primary Examiner* — Mary Wilczewski
(74) *Attorney, Agent, or Firm* — Rabin & Berdo, P.C.

(57) ABSTRACT

A method of manufacturing an organic-light-emitting-diode (OLED) flat-panel light-source apparatus. The method includes depositing a metal layer on a substrate and patterning the metal layer to form a plurality of subsidiary electrodes, forming an insulating layer on the substrate including the plurality of subsidiary electrodes and forming a first subsidiary electrode layer by etching the insulating layer until some of the plurality of subsidiary electrodes are exposed, and sequentially forming an anode, an organic emission layer (EML), and a cathode on the substrate on which the first subsidiary electrode layer is formed.

4 Claims, 11 Drawing Sheets

(56) References Cited

U.S. PATENT DOCUMENTS

| | | | |
|---|---|---|---|
| 6,777,724 B2 | 8/2004 | Duggal et al. | |
| 6,787,994 B2 | 9/2004 | Cok | |
| 7,161,184 B2* | 1/2007 | Miyagi et al. | 257/88 |
| 7,291,973 B2 | 11/2007 | Ishihara et al. | |
| 7,294,959 B2 | 11/2007 | Cok et al. | |
| 7,348,738 B2 | 3/2008 | Foust et al. | |
| 7,579,774 B2* | 8/2009 | Yamazaki et al. | 313/505 |
| 7,867,054 B2 | 1/2011 | Choi et al. | |
| 7,898,170 B2 | 3/2011 | Kobayashi | |
| 7,902,751 B2 | 3/2011 | Hayashi | |
| 8,058,800 B2 | 11/2011 | Hwang et al. | |
| 8,305,294 B2 | 11/2012 | Cok et al. | |
| 8,389,981 B2* | 3/2013 | Jun et al. | 257/40 |
| 8,421,064 B2* | 4/2013 | Han et al. | 257/40 |
| 8,487,338 B2* | 7/2013 | Seo et al. | 257/99 |
| 8,592,852 B2* | 11/2013 | Ibe et al. | 257/99 |
| 8,659,011 B2* | 2/2014 | Yokoyama et al. | 257/40 |
| 2005/0116634 A1 | 6/2005 | Hosokawa et al. | |
| 2006/0214553 A1 | 9/2006 | Nagara et al. | |
| 2006/0260679 A1 | 11/2006 | Aratani et al. | |
| 2008/0001537 A1 | 1/2008 | Chen et al. | |
| 2008/0032585 A1* | 2/2008 | Yamaguchi | 445/49 |
| 2010/0140598 A1 | 6/2010 | Paravia et al. | |
| 2011/0122355 A1* | 5/2011 | Matsumuro et al. | 349/143 |
| 2013/0189895 A1* | 7/2013 | Han et al. | 445/24 |

FOREIGN PATENT DOCUMENTS

| | | |
|---|---|---|
| JP | 2004-158661 A | 6/2004 |
| JP | 2008-171580 A | 7/2008 |
| KR | 10-2005-0095500 A | 9/2005 |
| KR | 20080058883 A | 6/2008 |
| WO | 2007/115651 A1 | 10/2007 |

\* cited by examiner

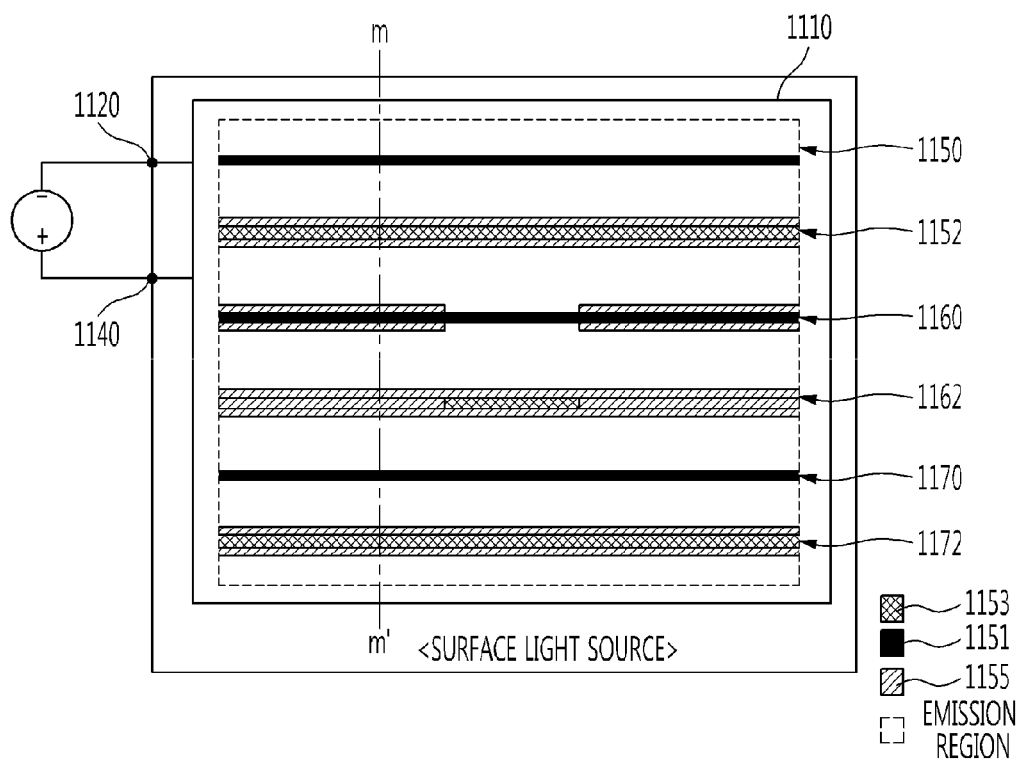

METHOD OF MANUFACTURING ORGANIC-LIGHT-EMITTING-DIODE FLAT-PANEL LIGHT-SOURCE APPARATUS

CROSS-REFERENCE TO RELATED APPLICATION

This application is a divisional of co-pending application Ser. No. 13/078,095 filed on Apr. 1, 2011, and claims priority to and the benefit of Korean Patent Application Nos. 10-2010-0032773 filed Apr. 9, 2010, and 10-2010-0107660 filed Nov. 1, 2010, the disclosure of which is incorporated herein by reference in its entirety.

BACKGROUND

1. Field of the Invention

The present invention relates to an organic-light-emitting-diode (OLED) flat-panel light-source apparatus and, more particularly, to an OLED flat-panel light-source apparatus and a method of manufacturing the same, which may improve the uniformity of electrical and optical properties of a large-area OLED flat-panel light-source apparatus required for an illumination system and a display device.

2. Discussion of Related Art

An organic light emitting diode (OLED) flat-panel light-source technique may be applied in various fields including an energy-saving eco-friendly illumination system, a flexible display device, a medical illumination system, and a backlight unit (BLU) of an LCD display device.

FIGS. 1 and 2 are a cross-sectional view and plan view, respectively, of a conventional OLED flat-panel light-source apparatus.

Referring to FIGS. 1 and 2, the conventional OLED flat-panel light-source apparatus may include a substrate 110, an anode 120, an organic emission layer (EML) 130, and a cathode 140.

The organic EML 130 may be interposed between the anode 120 and the cathode 140, each of which may be formed of a transparent metal layer or a reflective metal layer. When power is applied between the anode 120 and the cathode 140, the organic EML 130 may emit light.

However, the conventional OLED flat-panel light-source apparatus should supply current to the organic EML 130 through the anode 120 and the cathode 140 so that the organic EML 130 can emit light. In this case, IR-drop may occur due to resistance components of the anode 120 and the cathode 140. Thus, the conventional OLED flat-panel light-source apparatus may have non-uniform electrical and optical properties according to a position of an emission region due to the IR-drop. Also, in the conventional OLED flat-panel light-source apparatus, the emission region may be increased due to the scaling-up of OLED flat-panel light-surface apparatuses, thus increasing the non-uniformity of the electrical and optical properties.

In order to overcome the above-described drawbacks, an OLED flat-panel light-source apparatus using a subsidiary electrode layer has lately been proposed to reduce a sheet resistance component of an electrode and the non-uniformity of the electrical and optical properties due to the IR-drop.

FIGS. 3 through 6 are diagrams of an OLED flat-panel light-source apparatus including a subsidiary electrode layer. Specifically, FIGS. 3 and 4 are a cross-sectional view and plan view, respectively, of an OLED flat-panel light-source apparatus in which a subsidiary electrode is formed between an anode and an organic material, and FIGS. 5 and 6 are a cross-sectional view and plan view, respectively, of an OLED flat-panel light-source apparatus in which a subsidiary electrode is formed between an anode and a substrate.

Referring to FIGS. 3 through 6, the OLED flat-panel light-source apparatus may include a substrate 310, an anode 320, an organic EML 330, a cathode 340, and a subsidiary electrode layer. Here, the subsidiary electrode layer may include a plurality of subsidiary electrodes 350 and an insulating layer 354 configured to compensate the coverage of the plurality of subsidiary electrodes 350.

Each of the subsidiary electrodes 350 may include a metal layer 352 having a low sheet resistance. Thus, the plurality of subsidiary electrodes 350 may reduce a sheet-resistance component of the anode 320 or the cathode 340, thereby reducing non-uniformity due to IR-drop.

However, it is difficult to embody a large-area OLED flat-panel light-source apparatus having uniform electrical and optical properties using a conventional method of manufacturing a large-area OLED flat-panel light-source apparatus.

SUMMARY OF THE INVENTION

The present invention is directed to an organic-light-emitting-diode (OLED) flat-panel light-source apparatus and a method of manufacturing the same, which may improve the electrical and optical properties of a large-area OLED flat-panel light-source apparatus.

One aspect of the present invention provides an OLED flat-panel light-source apparatus including: an anode and a cathode, to which externally applied power is applied, disposed on a substrate; an organic emission layer (EML) interposed between the anode and the cathode and configured to emit light due to power supplied through the anode and the cathode; and a subsidiary electrode layer including a plurality of subsidiary electrodes bonded to the anode or the cathode and configured to supply power to the anode or the cathode or electrically insulated from the anode or the cathode and configured to supply power to other emission regions.

Another aspect of the present invention provides a method of manufacturing an OLED flat-panel light-source apparatus. The method includes: depositing a metal layer on a substrate and patterning the metal layer to form a plurality of subsidiary electrodes; forming an insulating layer on the substrate including the plurality of subsidiary electrodes and forming a first subsidiary electrode layer by etching the insulating layer until some of the plurality of subsidiary electrodes are exposed; and sequentially forming an anode, an organic EML, and a cathode on the substrate on which the first subsidiary electrode layer is formed.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIGS. 11 and 12 are a cross-sectional view and plan view, respectively, of an OLED flat-panel light-source apparatus according to a third exemplary embodiment of the present invention;

DETAILED DESCRIPTION OF EMBODIMENTS

The present invention will now be described more fully hereinafter with reference to the accompanying drawings, in which exemplary embodiments of the invention are shown. Descriptions of well-known components and processing techniques are omitted so as not to unnecessarily obscure the embodiments of the present invention.

Figure 1:
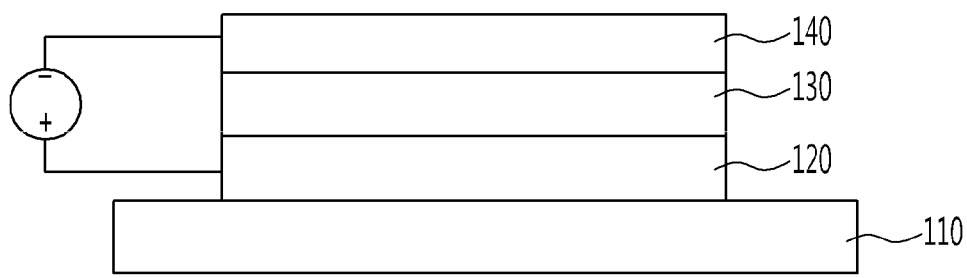
FIGS. 1 and 2 are a cross-sectional view and plan view, respectively, of a conventional organic-light-emitting-diode (OLED) flat-panel light-source apparatus.
Figure 2:
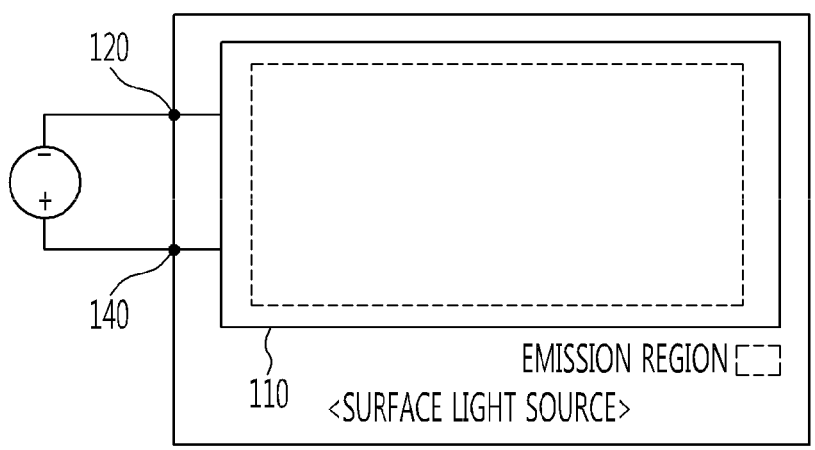
Figure 3:
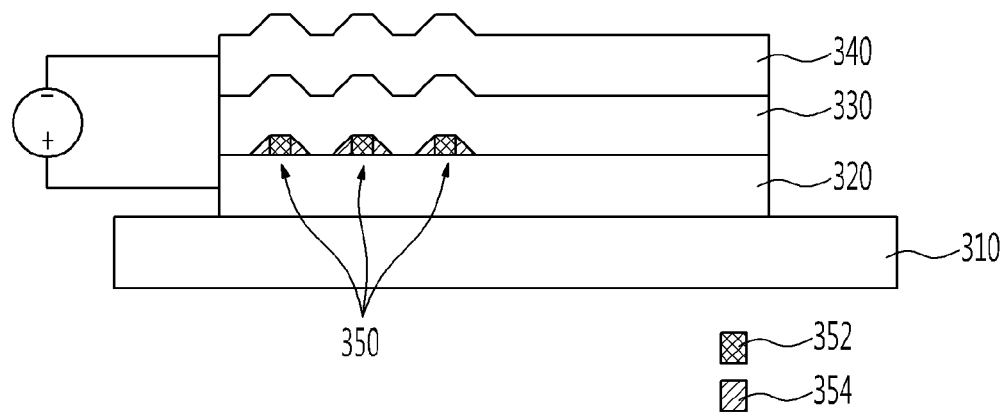
FIGS. 3 and 4 are a cross-sectional view and plan view, respectively, of an OLED flat-panel light-source apparatus in which a subsidiary electrode is formed between an anode and an organic material.
Figure 4:
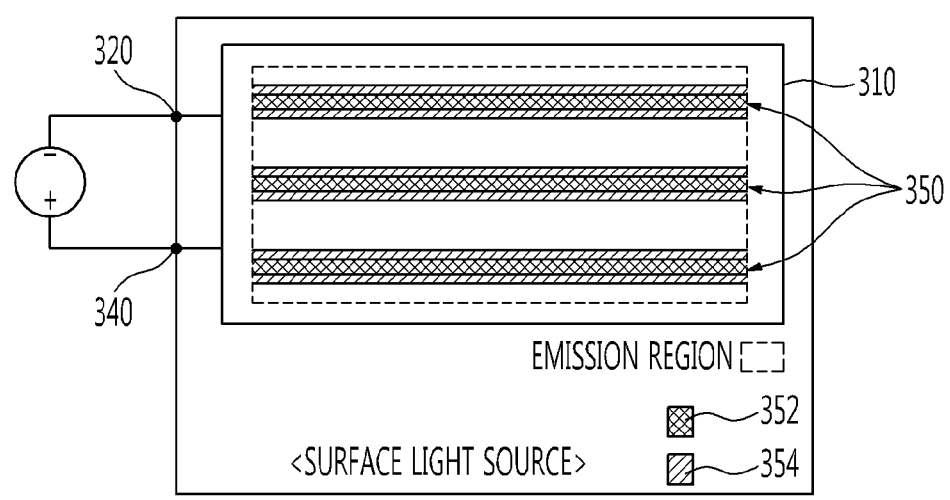
Figure 5:
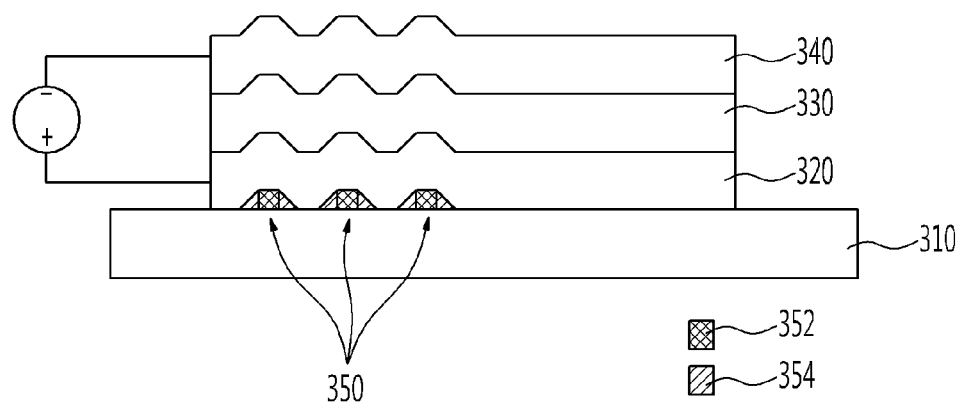
FIGS. 5 and 6 are a cross-sectional view and plan view, respectively, of an OLED flat-panel light-source apparatus in which a subsidiary electrode is formed between an anode and a substrate.
Figure 6:
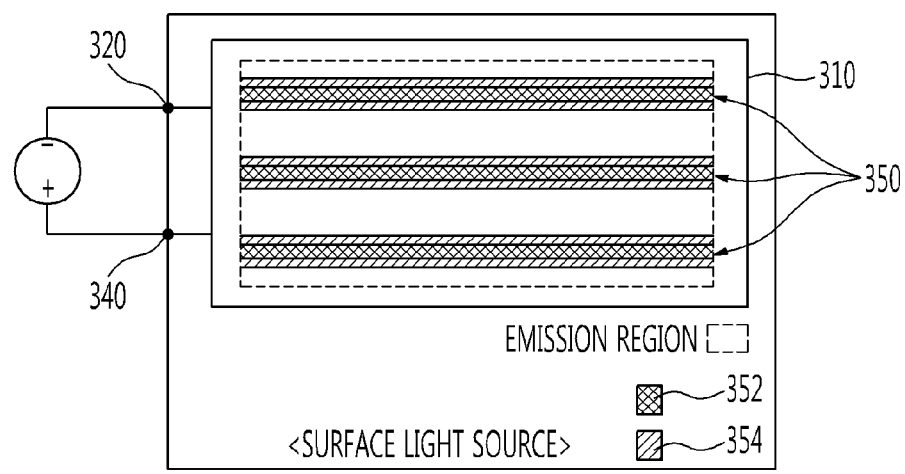
Figure 7A:
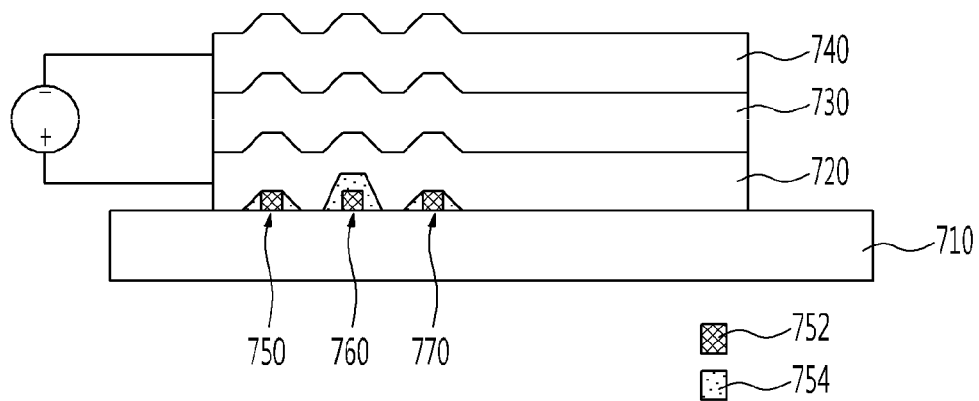
FIGS. 7A, 7B, and 8 are a cross-sectional view and plan view, respectively, of an OLED flat-panel light-source apparatus according to a first exemplary embodiment of the present invention.
Figure 7B:
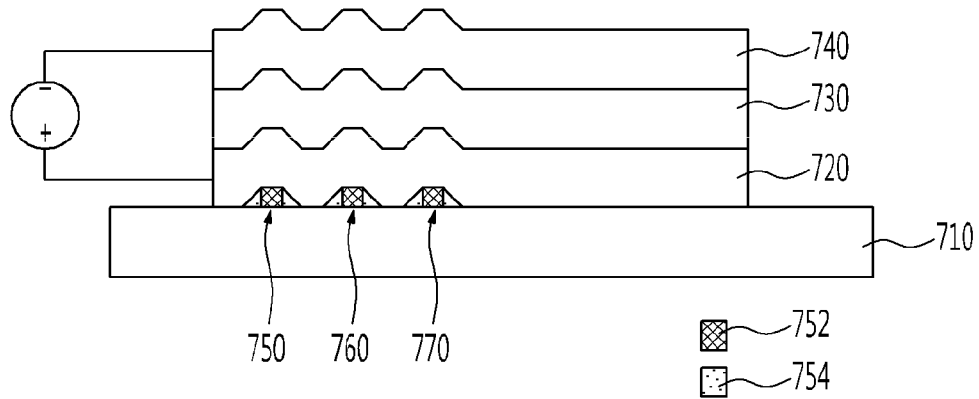
Figure 8:
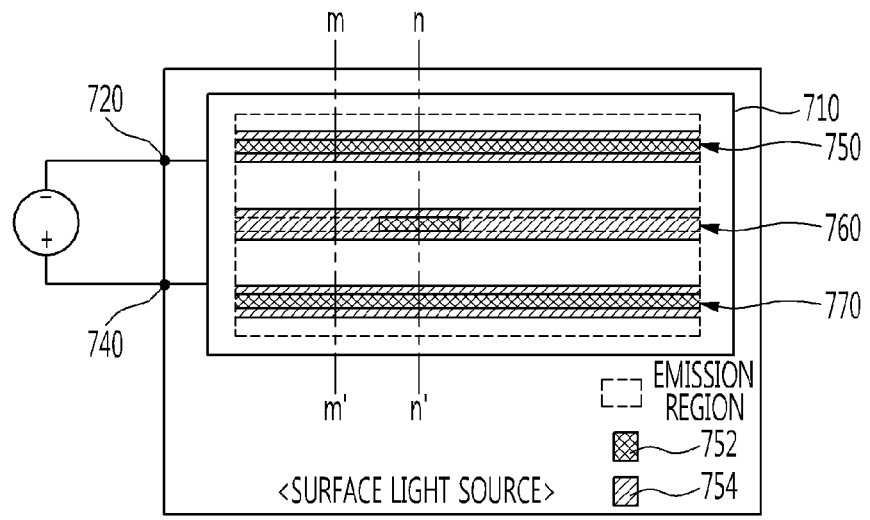

FIGS. 7A, 7B, and 8 are a cross-sectional view and plan view, respectively, of an OLED flat-panel light-source apparatus according to a first exemplary embodiment of the present invention. Specifically, FIG. 7A is a cross-sectional view taken along line m-m' of the OLED flat-panel light-source apparatus of FIG. 8, and FIG. 7B is a cross-sectional view taken along line n-n' of the OLED flat-panel light-source apparatus of FIG. 8.

Referring to FIGS. 7A, 7B, and 8, the OLED flat-panel light-source apparatus according to the present invention may include a substrate 710, an anode 720, an organic EML 730, a cathode 740, and a subsidiary electrode layer. Here, the subsidiary electrode layer may include first through third subsidiary electrodes 750, 760, and 770 and an insulating layer 754. Here, the subsidiary electrode layer may include at least one subsidiary electrode.

The anode 720 and the cathode 740 may be sequentially formed on the substrate 710, and externally applied power may be supplied to the organic EML 730. Here, each of the anode 720 and the cathode 740 may include a transparent metal layer or a reflective metal layer.

The organic EML 730 may be interposed between the anode 720 and the cathode 740 and emit light due to power supplied through the anode 720 and the cathode 740. Here, the organic EML 730 may be formed of an organic compound including an electron transport layer (ETL), an EML, and a hole transport layer (HTL).

The subsidiary electrode layer may include first and third subsidiary electrodes 750 and 770, which may be bonded to the anode 720 and function to reduce a resistance component of the anode 720, and a second subsidiary electrode 760, which may supply power to other emission regions of the OLED flat-panel light-source apparatus. Here, each of the first through third subsidiary electrodes 750, 760, and 770 may include a metal layer 752 having a low sheet resistance, and the second subsidiary electrode 760 may be electrically insulated from the anode 720 by an insulating layer 754. Hereinafter, construction and operation of each of the subsidiary electrodes 750, 760, and 770 will be described in detail.

Each of the first and third subsidiary electrodes 750 and 770 may be electrically connected in parallel to the anode 720 in the emission region and function to reduce the influence of IR-drop due to a driving current. That is, the first and third subsidiary electrodes 750 and 770 may supply additional power to the anode 720 and reduce the influence of IR-drop.

The second subsidiary electrode 760 may supply power to the other emission regions of the OLED flat-panel light-source apparatus. Specifically, as shown in FIG. 7A, the second subsidiary electrode 760 may be electrically insulated from the anode 720 by the insulating layer 754 and serve as a coated electric wire for transmitting current in the emission region that may be less affected by the IR-drop. In contrast, as shown in FIG. 7B, the second subsidiary electrode 760 may be bonded to the anode 720 and serve to supply power in the emission region that may be more affected by the IR-drop.

Accordingly, the OLED flat-panel light-source apparatus according to the present invention may not be affected by IR-drop but receive power using the second subsidiary electrode 760 even in the emission region disposed a far distance from a driver unit (not shown). Thus, the non-uniformity of electrical and optical properties of a large-area OLED flat-panel light-source apparatus due to the IR-drop of the anode 720 may be overcome without additional thin layers and manufacturing processes.

Figure 9:
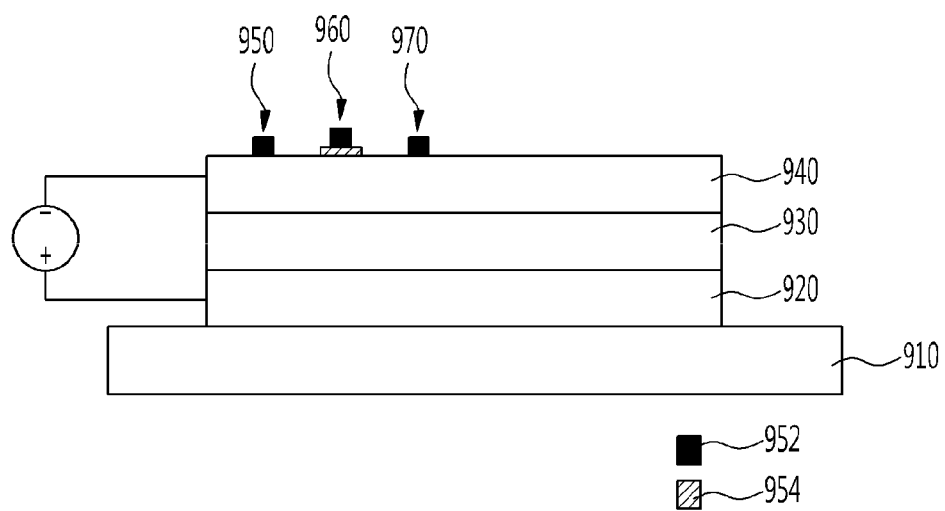
FIGS. 9 and 10 are a cross-sectional view and plan view, respectively, of an OLED flat-panel light-source apparatus according to a second exemplary embodiment of the present invention.
Figure 10:
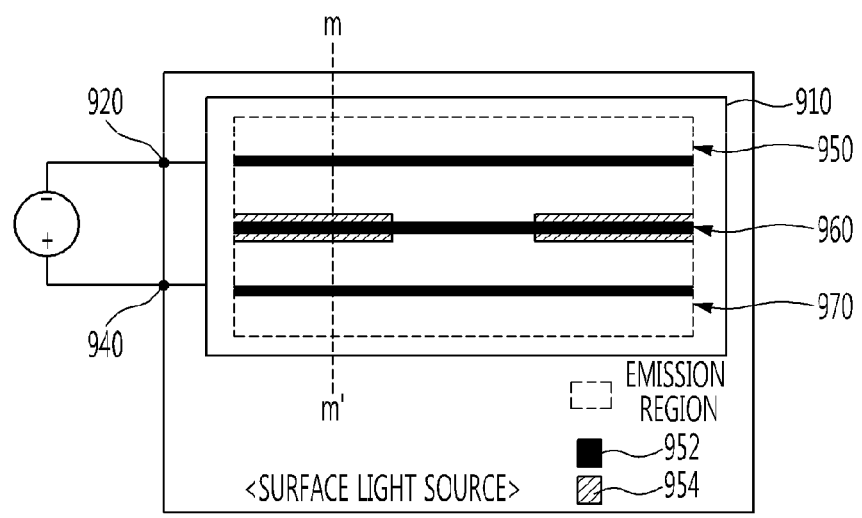

FIGS. 9 and 10 are a cross-sectional view and plan view, respectively, of an OLED flat-panel light-source apparatus according to a second exemplary embodiment of the present invention. Specifically, FIG. 9 is a cross-sectional view taken along line m-m' of the OLED flat-panel light-source apparatus of FIG. 10.

Referring to FIGS. 9 and 10, the OLED flat-panel light-source apparatus according to the second embodiment may include a subsidiary electrode layer disposed on a cathode 940 unlike the OLED flat-panel light-source apparatus according to the first embodiment.

The subsidiary electrode layer may include first and third subsidiary electrodes 950 and 970, which may be bonded to the cathode 940, and function to reduce a resistance component of the cathode 940, and a second subsidiary electrode 960, which may be separated from the cathode 940 and function to supply power to other emission regions of the flat-panel light-source apparatus. Here, each of the first through third subsidiary electrodes 950, 960, and 970 may include a metal layer 952 having a low sheet resistance, and the second subsidiary electrode 960 may be electrically insulated from the cathode 940 by an insulating layer 954.

Each of the first and third subsidiary electrodes 950 and 970 may be electrically connected in parallel to the cathode 940 in an emission region and reduce the influence of IR-drop due to a driving current.

The second subsidiary electrode 960 may supply power to the other emission regions of the OLED flat-panel light-source apparatus. Specifically, the second subsidiary electrode 960 may be electrically insulated from the cathode 940 by the insulating layer 954 and serve as a coated electric wire for transmitting current in the emission region that may be less affected by the IR-drop. In contrast, the second subsidiary electrode 960 may be bonded to the cathode 940 and serve to supply power in the emission region that may be more affected by the IR-drop.

Accordingly, the non-uniformity of electrical and optical properties of a large-area OLED flat-panel light-source apparatus due to the IR-drop of the cathode 940 may be overcome.

Figure 11:
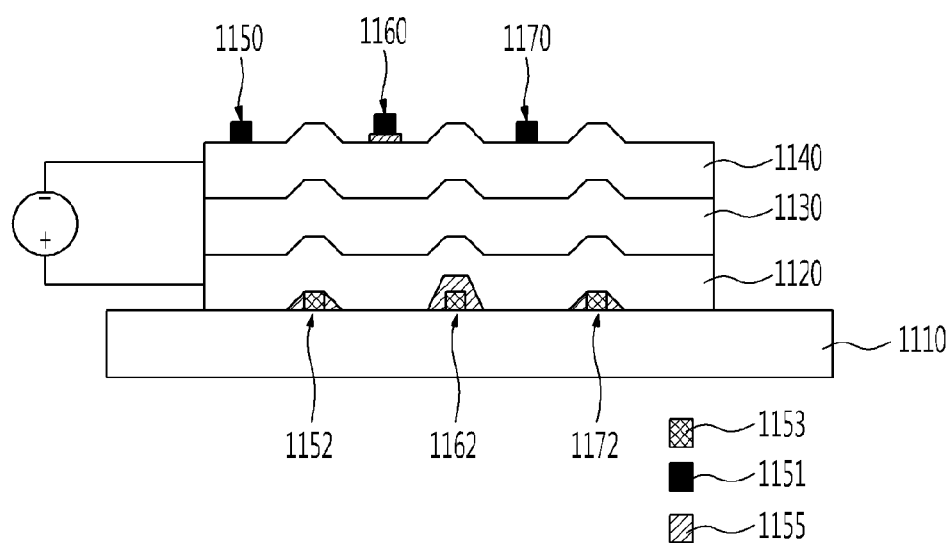

FIGS. 11 and 12 are a cross-sectional view and plan view, respectively, of an OLED flat-panel light-source apparatus according to a third exemplary embodiment of the present invention. Specifically, FIG. 11 is a cross-sectional view taken along line m-m' of the OLED flat-panel light-source apparatus of FIG. 12.

Referring to FIGS. 11 and 12, the OLED flat-panel light-source apparatus according to the third embodiment may include a first subsidiary electrode layer interposed between a substrate 1110 and an anode 1120 and a second subsidiary electrode layer disposed on a cathode 1140.

The first subsidiary electrode layer may include first and third subsidiary electrodes 1152 and 1172, which may be bonded to the anode 1120 and reduce a resistance component of the anode 1120, and a second subsidiary electrode 1162, which may be separated from the anode 1120 and supply power to other emission regions of the OLED flat-panel light-source apparatus. Here, each of the subsidiary electrodes 1152, 1162, and 1172 may include a metal layer 1153 having a low sheet resistance, and the second subsidiary electrode 1162 may be electrically insulated from the anode 1120 by an insulating layer 1155.

Each of the first and third subsidiary electrodes 1152 and 1172 may be electrically connected in parallel to the anode 1120 in an emission region and reduce the influence of IR-drop due to a driving current.

The second subsidiary electrode 1162 may supply power to the other emission regions of the OLED flat-panel light-source apparatus. The second subsidiary electrode 1162 may be electrically insulated from the anode 1120 and serve as a coated electric wire for transmitting current in an emission region that may be less affected by the IR-drop. In contrast, the second subsidiary electrode 1162 may be bonded to the anode 1120 and supply power in an emission region that may be more affected by the IR-drop.

The second subsidiary electrode layer may include fourth and sixth subsidiary electrodes 1150 and 1170, which may be bonded to the cathode 1140 and reduce a resistance component of the cathode 1140, and a fifth subsidiary electrode 1160, which may be separated from the cathode 1140 and supply power to the other emission regions of the OLED flat-panel light-source apparatus. Here, each of the subsidiary electrodes 1150, 1160, and 1170 may include a metal layer 1151 having a low sheet resistance, and the fifth subsidiary electrode 1160 may be electrically insulated from the cathode 1140 by an insulating layer 1155.

Each of the fourth and sixth subsidiary electrodes 1150 and 1170 may be electrically connected in parallel to the cathode 1140 in an emission region and reduce the influence of IR-drop due to a driving current.

The fifth subsidiary electrode 1160 may supply power to the other emission regions of the OLED flat-panel light-source apparatus. Specifically, the fifth subsidiary electrode 1160 may be electrically insulated from the cathode 1140 and serve as a coated electric wire for transmitting current in an emission region that may be less affected by the IR-drop. In contrast, the fifth subsidiary electrode 1160 may be bonded to the cathode 1140 and serve to supply power in an emission region that may be more affected by the IR-drop.

Accordingly, the non-uniformity of electrical and optical properties of a large-area OLED flat-panel light-source apparatus due to the IR-drop of an anode and a cathode may be overcome.

Figure 13A:
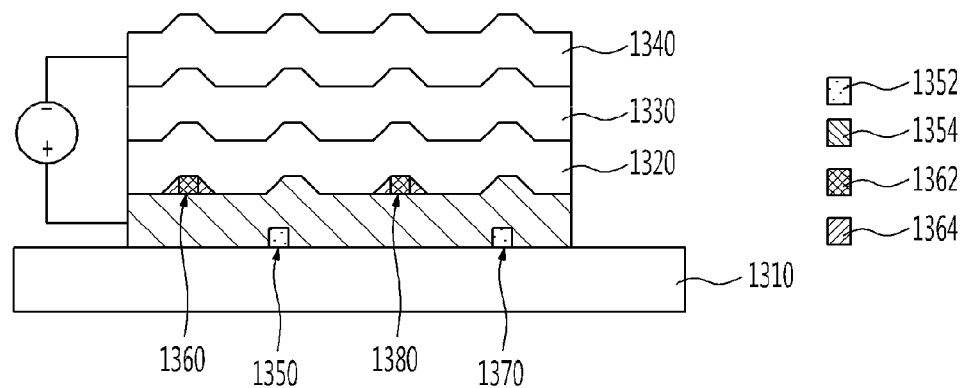
FIGS. 13A, 13B and 14 are a cross-sectional view and plan view, respectively, of an OLED flat-panel light-source apparatus according to a fourth exemplary embodiment of the present invention.
Figure 13B:
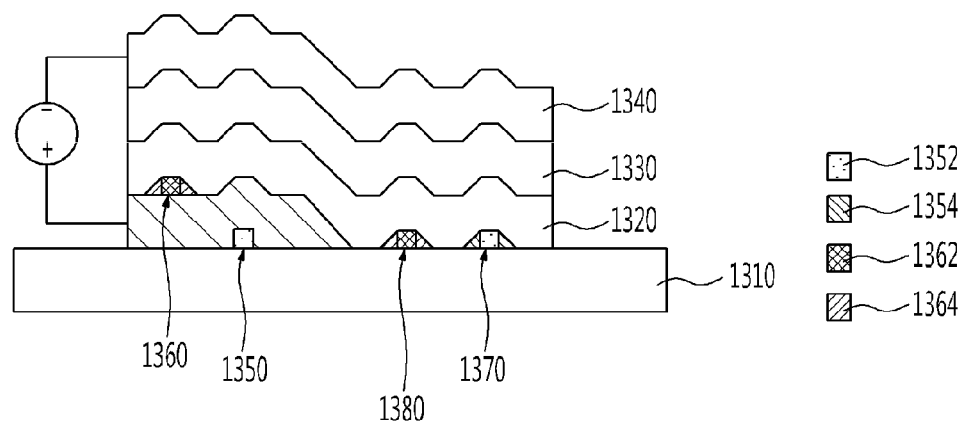
Figure 14:
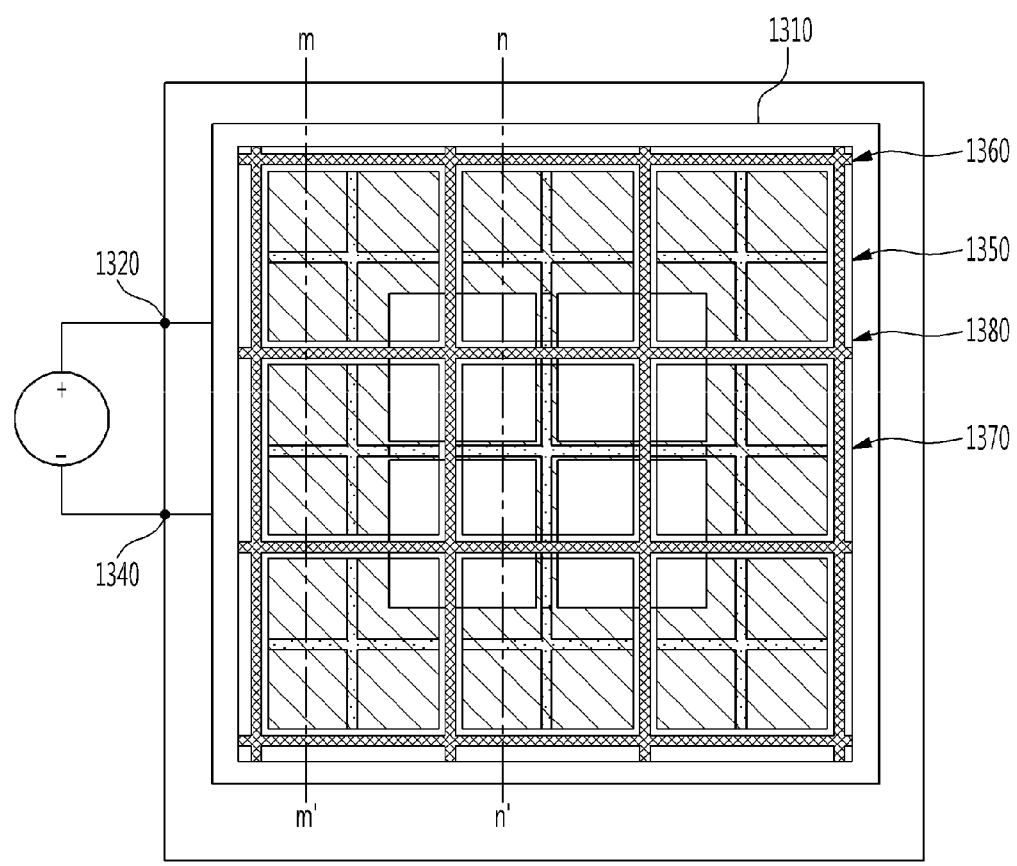

FIGS. 13A, 13B and 14 are a cross-sectional view and plan view, respectively, of an OLED flat-panel light-source apparatus according to a fourth exemplary embodiment of the present invention. Specifically, FIG. 13A is a cross-sectional view taken along line m-m' of the OLED flat-panel light-source apparatus of FIG. 14, and FIG. 13B is a cross-sectional view taken along line n-n' of the OLED flat-panel light-source apparatus of FIG. 14.

In the fourth embodiment, the above-described OLED flat-panel light-source apparatus including the subsidiary electrode layer may be structurally improved so that the OLED flat-panel light-source apparatus can include a plurality of subsidiary electrode layers. Also, from the plan view, the OLED flat-panel light-source apparatus according to the fourth embodiment may be configured to have a lattice structure, thereby reducing the influence of IR-drop. For brevity, an OLED flat-panel light-source apparatus including two subsidiary electrode layers will be described as an example.

Referring to FIGS. 13A, 13B, and 14, the OLED flat-panel light-source apparatus according to the fourth embodiment may include a first subsidiary electrode layer including first and third subsidiary electrodes 1350 and 1370 and a first insulating layer 1354 and a second subsidiary electrode layer including second and fourth subsidiary electrodes 1360 and 1380 and a second insulating layer 1364. Here, each of the first and third subsidiary electrodes 1350 and 1370 may include a first metal layer 1352, and each of the second and fourth subsidiary electrodes 1360 and 1380 may include a second metal layer 1362.

As shown in FIG. 13A, the first and third subsidiary electrodes 1350 and 1370 of the first subsidiary electrode layer may be electrically insulated from the anode 1320 and serve as coated electric wires for supplying power to other emission regions of the flat-panel light-source apparatus in an emission region that may be less affected by the IR-drop. Also, as shown in FIG. 13B, the third subsidiary electrode 1370 of the first subsidiary electrode layer may be bonded to the anode 1320 and serve to supply power to the anode 1320 in an emission region that may be more affected by the IR-drop. Furthermore, the second subsidiary electrode layer may be bonded to the anode 1320 and reduce a resistance component of the anode 1320.

Hereinafter, a method of manufacturing the OLED flat-panel light-source apparatus according to the third embodiment of the present invention will be described. Here, since the methods of manufacturing the OLED flat-panel light-source apparatuses according to the first and second embodiments of the present invention include about the same processes as the method of manufacturing the OLED flat-panel light-source apparatus according to the third embodiment of the present invention, a detailed description thereof will be omitted.

FIGS. 15 through 19 are process flowcharts illustrating a method of manufacturing the OLED flat-panel light-source apparatus shown in FIGS. 11 and 12.

Figure 15:
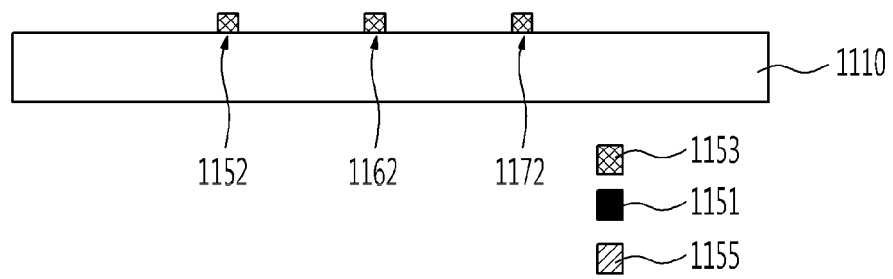
FIGS. 15 through 19 are process flowcharts illustrating a method of manufacturing the OLED flat-panel light-source apparatus shown in FIGS. 11 and 12.

Referring to FIG. 15, a metal layer 1153 may be deposited on a substrate 1110 and patterned, thereby forming first through third subsidiary electrodes 1152, 1162, and 1172. Here, the metal layer 1153 may be formed using a metal having a sheet resistance.

Figure 16:
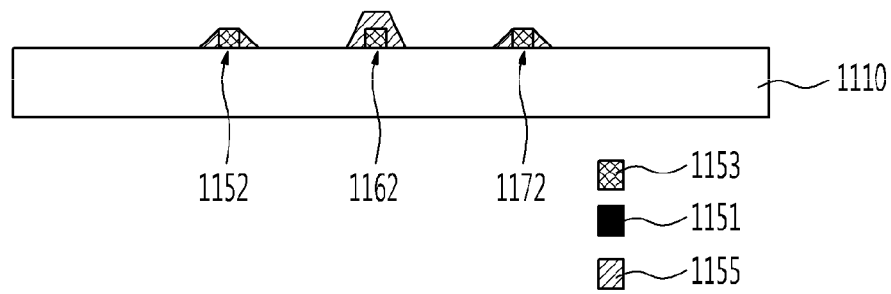

Referring to FIG. 16, an insulating layer 1155 may be formed on the substrate 1110 including the first through third subsidiary electrodes 1152, 1162, and 1172 and etched to expose the second subsidiary electrode 1162 out of the first through third subsidiary electrodes 1152, 1162, and 1172, thereby forming a first subsidiary electrode layer. The first subsidiary electrode layer may include a plurality of subsidiary electrode layers. Here, since a method of forming the plurality of subsidiary electrode layers is obvious to those skilled in the art, a description thereof will be omitted.

Figure 17:
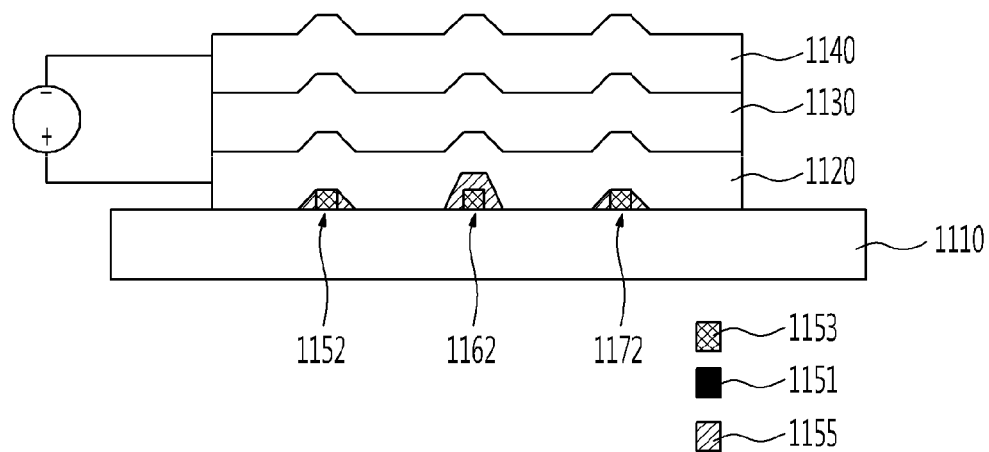

Referring to FIG. 17, an anode 1120, an organic EML 1130, and a cathode 1140 may be sequentially formed on the substrate 1110 having the first subsidiary electrode layer.

Figure 18:
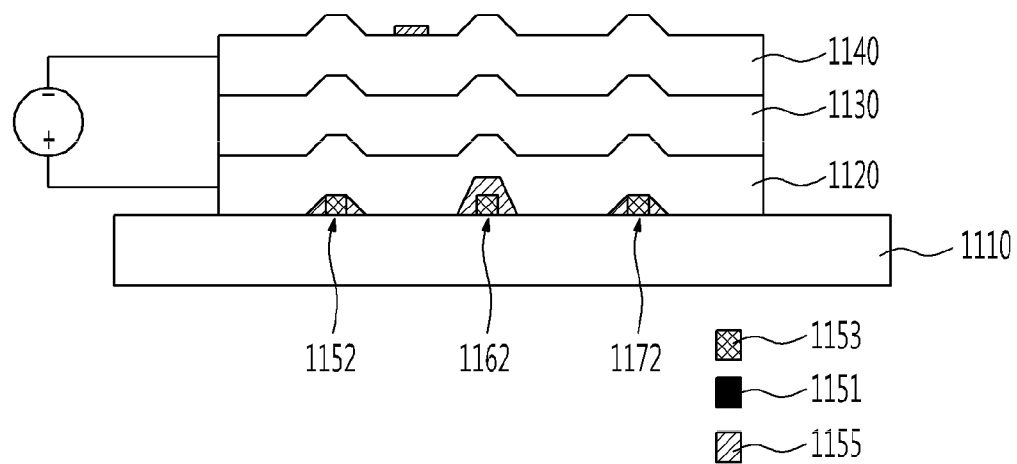

Referring to FIG. 18, an insulating layer 1155 may be formed on the cathode 1140 and etched. Here, the insulating layer 1155 may electrically insulate a subsequent sixth subsidiary electrode 1160 from the cathode 1140.

Figure 19:
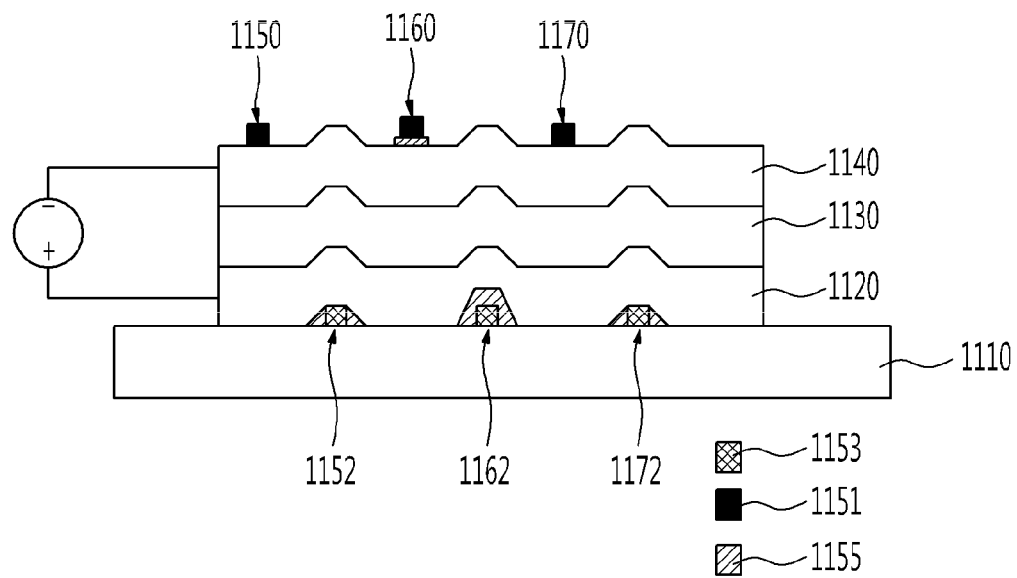

Referring to FIG. 19, a metal layer 1151 may be formed on the cathode 1140 on which the insulating layer 1155 is formed. The metal layer 1151 may be patterned, thereby forming a second subsidiary electrode layer including fifth through seventh subsidiary electrodes 1150, 1160, and 1170 on the insulating layer 1155 or the cathode 1140.

According to the present invention as described above, an OLED flat-panel light-source apparatus and a method of manufacturing the same can improve the uniformity of electrical and optical properties of a large-area OLED flat-panel light-source apparatus.

Furthermore, the influence of IR-drop of an anode and a cathode can be overcome without classifying an OLED flat-panel light-source apparatus into pixels or segments so that a large-area OLED flat-panel light-source apparatus can be manufactured at low cost.

In the drawings and specification, there have been disclosed typical exemplary embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A method of manufacturing an organic-light-emitting-diode (OLED) flat-panel light-source apparatus, the method comprising:
   depositing a metal layer on a substrate and patterning the metal layer to form a plurality of subsidiary electrodes;
   forming an insulating layer on the substrate including the plurality of subsidiary electrodes and forming a first subsidiary electrode layer by etching the insulating layer until some of the plurality of subsidiary electrodes are exposed; and
   sequentially forming an anode, an organic emission layer (EML), and a cathode on the substrate on which the first subsidiary electrode layer is formed;
   wherein some of the plurality of subsidiary electrodes are bonded to the anode and supply power to the anode in an emission region less affected by IR-drop, and others of the plurality of subsidiary electrodes are electrically insulated from the anode and supply power to other emission regions in an emission region more affected by the IR-drop.

2. A method of manufacturing an organic-light-emitting-diode (OLED) flat-panel light-source apparatus, the method comprising:
   depositing a first metal layer on a substrate and patterning the first metal layer to form a first plurality of subsidiary electrodes;
   forming a first insulating layer on the substrate including the first plurality of subsidiary electrodes and forming a first subsidiary electrode layer by etching the first insulating layer until some of the first plurality of subsidiary electrodes are exposed; and
   sequentially forming an anode, an organic emission layer (EML), and a cathode on the substrate on which the first subsidiary electrode layer is formed;
   forming a second insulating layer on the cathode and etching the second insulating layer; and
   depositing a second metal layer on the cathode on which the second insulating layer is formed and forming a second plurality of subsidiary electrodes on the second insulating layer by patterning the second metal layer to form a second subsidiary electrode layer.

3. A method of manufacturing an organic-light-emitting-diode (OLED) flat-panel light-source apparatus, the method comprising:
   depositing a first metal layer on a substrate and patterning the first metal layer to form a plurality of subsidiary electrodes on the substrate;
   forming an insulating layer on the substrate;
   depositing a second metal layer on the insulating layer;
   patterning the second metal layer to form at least one subsidiary electrode on the insulating layer; and
   forming a subsidiary electrode layer on the substrate by etching a portion of the insulating layer to expose at least one of the plurality of subsidiary electrodes on the substrate.

4. The method of claim 3, further comprising sequentially forming an anode, an organic emission layer (EML), and a cathode on the insulating layer and an exposed portion of the substrate.

* * * * *